United States Patent
Hwang et al.

(10) Patent No.: US 12,453,156 B1
(45) Date of Patent: Oct. 21, 2025

(54) HIGH-VOLTAGE ELECTROSTATIC DISCHARGE DEVICE

(71) Applicant: GlobalFoundries Singapore Pte. Ltd., Singapore (SG)

(72) Inventors: Kyong Jin Hwang, Singapore (SG); Jie Zeng, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/643,606

(22) Filed: Apr. 23, 2024

(51) Int. Cl.
*H10D 64/00* (2025.01)
*H10D 8/00* (2025.01)
*H10D 8/01* (2025.01)

(52) U.S. Cl.
CPC ............. *H10D 64/111* (2025.01); *H10D 8/00* (2025.01); *H10D 8/01* (2025.01); *H10D 64/112* (2025.01)

(58) Field of Classification Search
CPC . H01L 29/402; H01L 29/404; H01L 29/6609; H01L 29/861; H01L 23/60–62; H01L 27/0259–0262; H01L 27/0263; H01L 27/0265
See application file for complete search history.

(56) References Cited

U.S. PATENT DOCUMENTS

| | | |
|---|---|---|
| 5,011,784 A | 4/1991 | Ratnakumar |
| 6,472,286 B1 | 10/2002 | Yu |
| 7,968,936 B2 | 6/2011 | Denison et al. |
| 8,878,283 B2 | 11/2014 | Denison et al. |
| 8,912,600 B2 | 12/2014 | You |
| 9,018,705 B2 | 4/2015 | Hwang |
| 9,673,084 B2 | 6/2017 | Liu et al. |
| 10,529,812 B1 | 1/2020 | Edwards |
| 11,302,687 B2 | 4/2022 | Zeng et al. |
| 2003/0001206 A1 | 1/2003 | Negoro et al. |
| 2004/0108549 A1 | 6/2004 | Denison |
| 2005/0253216 A1 | 11/2005 | Tsuchiko |

(Continued)

FOREIGN PATENT DOCUMENTS

| | | |
|---|---|---|
| EP | 2622638 | 4/2017 |
| JP | 2013214662 A | 10/2013 |

(Continued)

OTHER PUBLICATIONS

Cha et al., "0.18μm 100V-rated BCD with Large Area Power LDMOS with ultra-low effective Specific Resistance", IEEE, Proceedings of the 2016 28th International Symposium on Power Semiconductor Devices and ICs {ISPSD), Jun. 12-16, 2016, 4 pages.

(Continued)

*Primary Examiner* — Steven B Gauthier
*Assistant Examiner* — Rhys Poniente Sheker
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to high-voltage electrostatic discharge devices and methods of manufacture. The structure includes: a semiconductor material including an emitter region, a base region adjacent to the emitter region; and a collector region; a thermally grown insulator region on the semiconductor material extending from the base region to the collector region; and a field plate on the thermally grown insulator region and overlapping with the base region.

16 Claims, 6 Drawing Sheets

(56) References Cited

U.S. PATENT DOCUMENTS

| | | | |
|---|---|---|---|
| 2008/0303057 A1 | 12/2008 | Iwamuro | |
| 2009/0072308 A1 | 3/2009 | Chen et al. | |
| 2010/0181596 A1 | 7/2010 | Suzuki et al. | |
| 2012/0241900 A1 | 9/2012 | Chen et al. | |
| 2014/0042544 A1 | 2/2014 | Karino | |
| 2014/0197491 A1 | 7/2014 | Yamaji | |
| 2014/0225156 A1* | 8/2014 | Zhan | H10D 89/815 |
| | | | 257/164 |
| 2014/0353799 A1 | 12/2014 | Hwang | |
| 2015/0048451 A1 | 2/2015 | Chan | |
| 2017/0054019 A1 | 2/2017 | Huang | |
| 2017/0170647 A1 | 6/2017 | Tanaka et al. | |
| 2018/0211950 A1* | 7/2018 | Chiu | H10D 89/911 |
| 2018/0286853 A1 | 10/2018 | Mallikarjunaswamy | |
| 2018/0323184 A1 | 11/2018 | Hung et al. | |
| 2019/0103396 A1 | 4/2019 | Zhan et al. | |
| 2019/0103498 A1 | 4/2019 | Pang et al. | |
| 2019/0259829 A1 | 8/2019 | Mun et al. | |
| 2021/0134787 A1* | 5/2021 | Zeng | H10D 89/819 |
| 2021/0184033 A1 | 6/2021 | Coyne et al. | |
| 2021/0327869 A1* | 10/2021 | Zeng | H10D 62/822 |
| 2022/0181474 A1* | 6/2022 | Mahajan | H10D 18/241 |
| 2023/0098207 A1* | 3/2023 | Ikeura | H10D 10/40 |
| | | | 257/488 |
| 2024/0222478 A1 | 7/2024 | Zhang et al. | |

FOREIGN PATENT DOCUMENTS

| | | |
|---|---|---|
| TW | I500156 | 9/2015 |
| TW | I563661 | 12/2016 |

OTHER PUBLICATIONS

Specification and Drawings filed Jan. 13, 2023 in U.S. Appl. No. 18/096,811, 25 pages.

A. Gendron et al., "Area-Efficient, Reduced and No. Snapback PNP-based ESD Protection in Advanced Smart Power Technology", Electrical Overstress/Electrostatic Discharge Symposium, 2006, IEEE, Abstract, 3 pages.

P. Renaud et al., "High robustness PNP-based structure for the ESD protection of high voltage I/Os in an advanced smart power technology", Bipolar/BiCMOS Circuits and Technology Meeting, 2007, IEEE, Abstract, 3 pages.

R. Zhu et al., "Implementation of High-Side, High-Voltage RESURF LDMOS in a sub-half Micron Smart Power Technology", Proceedings of 2001 International Symposium on Power Semiconductor Devices & ICs, 2001, IEEE, Abstract, 3 pages.

V. Khemka et al., "A Floating RESURF (FRESURF) LD-MOSFET Device Concept", IEEE Electron Device Letters, Oct. 2003, vol. 24, No. 10, IEEE, Abstract, 3 pages.

Specification and Drawings filed Dec. 27, 2023 in U.S. Appl. No. 18/397,008, 27 pages.

Office Action for U.S. Appl. No. 18/643,628 dated Sep. 12, 2024; 19 pages.

Response to Restriction Requirement dated Aug. 19, 2024 in U.S. Appl. No. 18/643,628, 1 page.

Extended European Search Report dated Mar. 21, 2025 for European Application No. EP 24205139.9-1001, 10 pages.

Response to Office Action dated Feb. 26, 2025 in U.S. Appl. No. 18/643,628 12 pages.

Final Office Action dated Jan. 16, 2025 in U.S. Appl. No. 18/643,628 17 pages.

Notice of Allowance and Fees dated May 29, 2025 in U.S. Appl. No. 18/643,628 11 pages.

* cited by examiner

HIGH-VOLTAGE ELECTROSTATIC DISCHARGE DEVICE

BACKGROUND

The present disclosure relates to semiconductor structures and, more particularly, to high-voltage electrostatic discharge devices and methods of manufacture.

Electrostatic discharge (ESD) is the transfer of electrostatic charge between bodies at different electrostatic potentials (voltages). As is known, an ESD event can destroy and seriously impair IC devices, e.g., circuits used in handheld devices such as cellular telephones. ESD protection devices are often built into IC devices in order to protect the various electronic components with the IC device High frequency circuit applications (e.g., ASIC high speed serial (HSS) links, power amplifiers in wireless communications, etc.) require low-capacitance electrostatic discharge (ESD) protection. For example, a power amplifier in CMOS technologies is susceptible to ESD events, which can damage the integrated circuit (IC), hence requiring ESD protection. Conventional ESD devices using, e.g., ESD diodes, etc., tend to have a high parasitic capacitance which impacts circuitry when the ESD is off, during normal operation.

SUMMARY

In an aspect of the disclosure, a structure comprises: a semiconductor material comprising an emitter region, a base region adjacent to the emitter region, and a collector region; a thermally grown insulator region on the semiconductor material extending from the base region to the collector region; and a field plate on the thermally grown insulator region and overlapping with the base region.

In an aspect of the disclosure, a structure comprises: a semiconductor material comprising an emitter region of a first dopant type, a base region of a second dopant type, and a collector region of the first dopant type; a thermal oxide region in the semiconductor material extending from the base region to the collector region; and a field plate on the thermally grown insulator region and partially overlapping with the base region, the field plate electrically coupled to the base region and the emitter region.

In an aspect of the disclosure, a method comprises: forming a semiconductor material comprising an emitter region, a base region adjacent to the emitter region; and a collector region; forming a thermally grown insulator region on the semiconductor material extending from the base region to the collector region; and forming a field plate on the thermally grown insulator region and overlapping with the base region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to high-voltage electrostatic discharge devices and methods of manufacture. More specifically, the high-voltage electrostatic discharge (HV-ESD) devices include a polysilicon field plate on a thermally grown oxide (e.g., LOCOS). Advantageously, the HV-ESD device exhibits stable DC leakage current due to a clean semiconductor interface with the LOCOS. Moreover, the HV-ESD device exhibits an increase ESD performance (e.g., about 15% to 35%) compared to conventional PNP or diode structures. For example, in embodiments, the LOCOS can help reduce the turn-on resistance.

In more specific embodiments, the HV-ESD device comprises a LOCOS structure on a base region and a collector region, with a conductivity type of the collector (e.g., p-type) being different than the base (e.g., n-type). A polysilicon field plate is provided on the LOCOS structure. The LOCOS structure includes a uniform thickness and the polysilicon field plate is narrower than the LOCOS structure. The polysilicon field plate may partially overlap with the base region. An emitter and the collector are adjacent to the LOCOS structure, with the polysilicon field plate closer to the emitter region than the collector region. The emitter region is coupled with the base region and the polysilicon field plate by a metallic interconnect (e.g., metallic field plate). A silicide block layer may be provided over the LOCOS.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
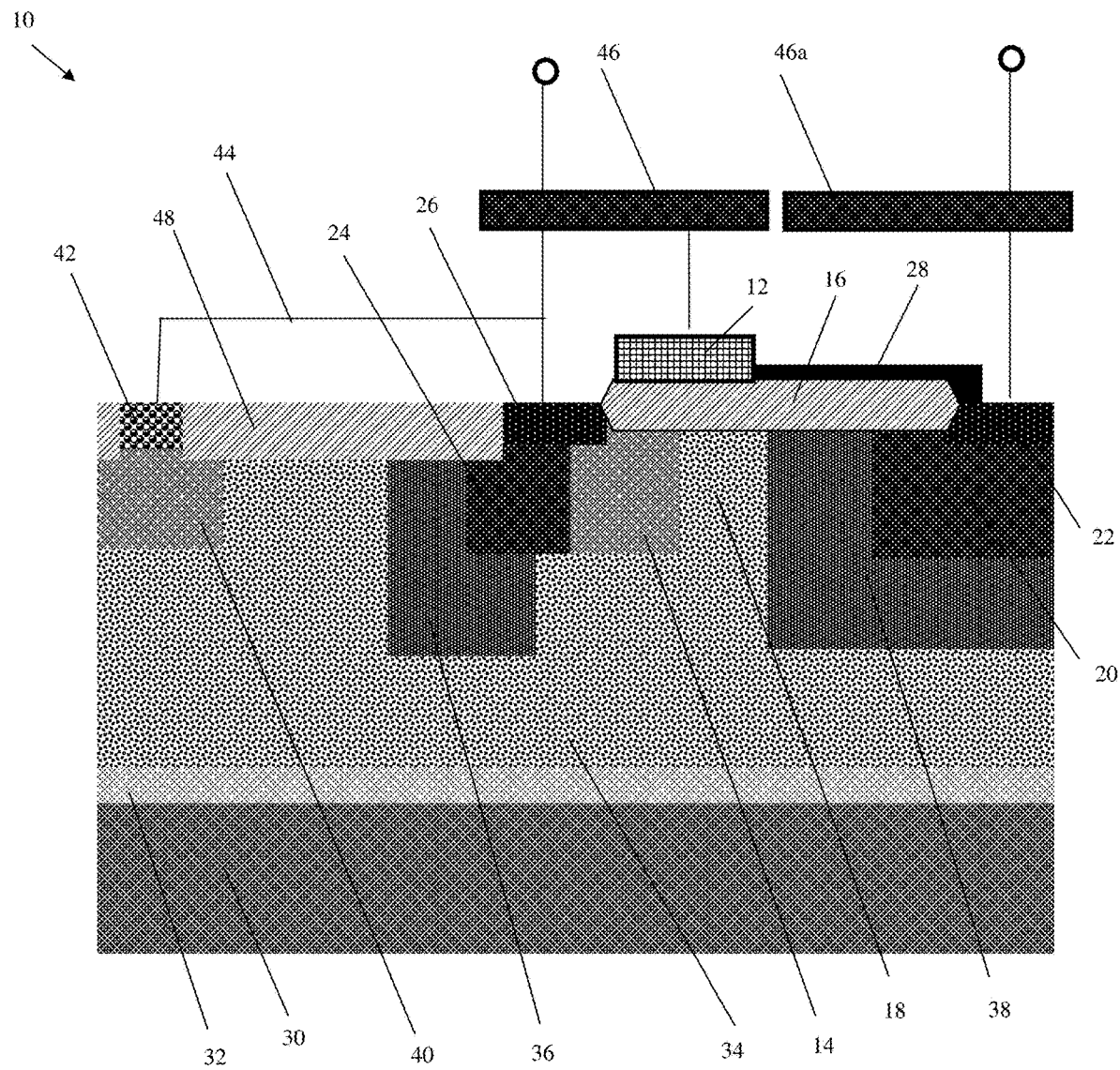
FIG. 1 shows a high-voltage electrostatic discharge device and methods of manufacture in accordance with aspects of the present disclosure.

FIG. 1 shows a high-voltage electrostatic discharge (HV-ESD) device and methods of manufacture in accordance with aspects of the present disclosure. In embodiments, the HV-ESD device 10 incudes a polysilicon field plate 12 sitting on a base region 14 (e.g., N-doped region) of a PNP device. In embodiments, the polysilicon field plate 12 may partially cover or overlap with the base region 14. Also, in embodiments, the polysilicon field plate 12 sits on a thermally grown oxide 16, e.g., LOCOS, which covers the base region 14 and a drift region 18 of a collector comprising, for example, p-doped regions (p-wells) 20, 38. The thermally grown oxide 16 may connect between P+ contact regions 22, 26 of the base region 14 and the collector region. In embodiments, the polysilicon field plate 12 may connect the base region 14 (e.g., N-doped region) to the emitter region comprising, for example, the doped regions 24, 36 and a P+ contact region 26. In optional embodiments, a silicide block 28 may be provided over the thermally grown oxide 16, e.g., LOCOS.

FIG. 1 further shows a semiconductor substrate 30. The semiconductor substrate 30 may comprise a p-type semiconductor substrate as is known in the art. The semiconductor substrate 30 may be composed of any suitable material including, but not limited to, Si, SiGe, SiGeC, SiC, GaAs, InAs, InP, and other III/V or II/VI compound semiconductors. In preferred embodiments, the semiconductor substrate 30 may comprise any suitable single crystallographic orientation (e.g., a <100>, <110>, <111>, or <001> crystallographic orientation).

A buried isolation structure 32 may be provided in the semiconductor substrate 30. In embodiments, the buried isolation structure 32 may be a buried N+ semiconductor layer formed by an ion implantation process as is known in the art. For example, the buried isolation structure 32 may be formed by introducing an n-type dopant by, for example, ion implantation in the semiconductor substrate 30. The n-type dopants may be, e.g., Arsenic (As), Phosphorus (P) and Antimony (Sb), among other suitable examples.

Still referring to FIG. 1, an N-semiconductor material 34 may be provided over the buried N+ semiconductor layer 30. In embodiments, the N-semiconductor material 34 may be epitaxial grown semiconductor material with an in-situ n-type dopant, e.g., Arsenic. In embodiments, the N-semiconductor material 34 may be composed of the same semiconductor material as the semiconductor substrate 30.

Examples of various epitaxial growth process processes that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth may be performed at a temperature of from about 300° C. to 800° C. The epitaxial growth can be performed utilizing any well-known precursor gas or gas mixture. Carrier gases like hydrogen, nitrogen, helium and argon can be used. An n-type dopant is typically added to the precursor gas or gas mixture.

FIG. 1 further shows an emitter region comprising doped regions 24, 26, 36. In embodiments, the doped regions 24, 26, 36 may comprise the emitter region, adjacent to the base region 14. The doped regions 24, 26, 36 will also comprise a stepped junction, e.g., the doped regions 24, 26, 36 are provided at different depths of the N-semiconductor material 34.

The doped region 24 is a p-type doped region and the doped region 36 is a deep p-type doped region. In embodiments, the deep p-type doped region 36 may be a high-voltage deep p-well within the N-semiconductor material 34. And, in embodiments, the doped region 36 may have a higher concentration of p-type dopant than the doped region 24. The doped region 26 may be a P+ contact region within the p-type doped region 36 and may also extend into the N-doped region 14, e.g., base region. In embodiments, the p-type doped region 24 may be partially within the deep p-type doped region 36 and the N-semiconductor material 32. The deep p-type doped region 36 may be a stepped junction with respect to the doped regions 14, 24.

FIG. 1 further shows a collector region comprising doped regions 20, 22, 38. In embodiments, the doped region 20 is a p-type doped region and the doped region 38 may be a deep p-type doped region. For example, the deep p-type doped region 38 may be a high-voltage deep p-well within the N-semiconductor material 34. The doped region 22 may be a P+ contact region within the p-type doped region 38. In embodiments, the p-type doped region 20 may be completely within the deep p-type doped region 38.

The device 10 also includes doped regions 40, 42. The doped region 42 is an n-type doped region within the N-semiconductor material 34. The doped region 42 is a N+ contact region in the doped region 42. The doped region 42 is electrically connected to the P+ contact region 26 (emitter region) by a wiring structure 44. The wiring structures 44 may also connect to the P+ contact region 22 (collector region). The wiring structures 44 may also electrically connect to metal or metal alloy field plates 46, 46a. In this way, the field plates 46, 46a will electrically connect to the collector region, emitter region and the base region. The field plate 46 overlaps the emitter region (e.g., P+ contact region 36) and the field plate 12. The wiring structure 44 may be any conventional wiring structure composed of interconnect structures and wiring layers as is known in the art such that no further explanation is required for a complete understanding of the present disclosure.

FIG. 1 further shows the thermally grown oxide 16, e.g., LOCOS, covering the base region 14, e.g., N-doped region, and the drift region 18 of the collector comprising, for example, the p-doped regions 20, 38. In embodiments, the LOCOS may have a uniform thickness. In addition, the LOCOS 16 may extend partially within the N-semiconductor material 34 and above a top surface of the N-semiconductor material 34. In embodiments, the thermally grown oxide 16, e.g., LOCOS, may cover the entire base region 14 or may partially overlap with the base region 14. The thermally grown oxide 16, e.g., LOCOS, between the emitter region and the collector region will prevent leakage issues due to a better quality oxide. The thermally grown oxide 16, e.g., LOCOS, will also push the current deeper into N-semiconductor material 34.

In addition, the thermally grown oxide 16, e.g., LOCOS, may extend between and contact the P+ contact region 22 and the P+ contact region 26. The field plate 12 may be connect to the emitter comprising, for example, the p-well 24 through the P+ contact region 26 and the base region 14 (e.g., N-type semiconductor material). The field plate 12 may be narrower than the thermally grown oxide 16, e.g., LOCOS. Also, the field plate 12 may be closer to the emitter region than the collector region. In optional embodiments, a silicide block 28 may be provided over the thermally grown oxide 16, e.g., LOCOS. The silicide block 28 may be, for example, a nitride material that extends from the field plate 12 to the P+ contact region 22.

As should be understood by those of skill in the art, LOCOS is a local oxidation of semiconductor material, e.g., Si. In the fabrication process, for example, $SiO_2$ is formed in selected areas on a semiconductor wafer having, for example, the Si—$SiO_2$ interface at a lower point than the rest of the silicon surface. In the thermal oxidation process, a thin layer of oxide (usually silicon dioxide) is provided on the surface of the semiconductor substrate. The process forces an oxidizing agent to diffuse into the semiconductor substrate at high temperature thus causing a reaction. Thermal oxidation may be applied to different materials, but most commonly involves the oxidation of silicon substrates to produce silicon dioxide.

In embodiments, the doped regions 14, 20, 22, 24, 26, 36, 38, 40, 42 may be formed by ion implantation processes. In embodiments, the n-typed doped regions 14, 40, 42 may be formed using n-type dopants; whereas the p-doped regions 20, 22, 24, 26, 36, 38 may be formed using p-type dopants. By way of example, respective patterned implantation masks may be used to define selected areas exposed for the implantations. The implantation mask used to select the exposed area for forming the doped regions 14, 40, 42 is stripped after implantation, and before the implantation mask used to form the p-doped regions 20, 22, 24, 26, 36, 38 (or vice versa). The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The p-type dopants may be, e.g., Boron (B), and the n-type dopants may be, e.g., Arsenic (As), Phosphorus (P) and Antimony (Sb), among other suitable examples.

Moreover, a silicide contact may be formed on the P+ contact regions 22, 26 and the N+ contact region 42, prior to forming the wiring structures 44. As should be understood by those of skill in the art, the silicide process begins with deposition of a thin transition metal layer, e.g., nickel, cobalt or titanium, over fully formed and patterned semiconductor devices (e.g., contact regions 22, 26, 42). In embodiments, the silicide block 28 will prevent silicide from forming on the thermally grown oxide 16. After deposition of the material, the structure is heated allowing the transition metal to react with exposed silicon (or other semiconductor material as described herein) in the active regions of the semiconductor device (e.g., doped contact regions 22, 26, 42) forming a low-resistance transition metal silicide. Following the reaction, any remaining transition metal is removed by chemical etching, leaving silicide contacts.

FIG. 1 further shows shallow trench isolation regions 48 formed in the N-semiconductor material 34, between the N+ contact region 42 and the P+ contact region 26. The shallow trench isolation regions 48 can be formed by conventional lithography, etching and deposition methods known to those of skill in the art. For example, a resist formed over the N-semiconductor material 34 is exposed to energy (light) and developed utilizing a conventional resist developer to form a pattern (opening). An etching process with a selective chemistry, e.g., reactive ion etching (RIE), will be used to transfer the pattern to the N-semiconductor material 34 to form one or more trenches through the openings of the resist. Following the resist removal by a conventional oxygen ashing process or other known stripants, the conductive material can be deposited by any conventional deposition processes, e.g., chemical vapor deposition (CVD) processes. Any residual material on the surface of the N-semiconductor material 34 can be removed by conventional chemical mechanical polishing (CMP) processes.

Figure 2:
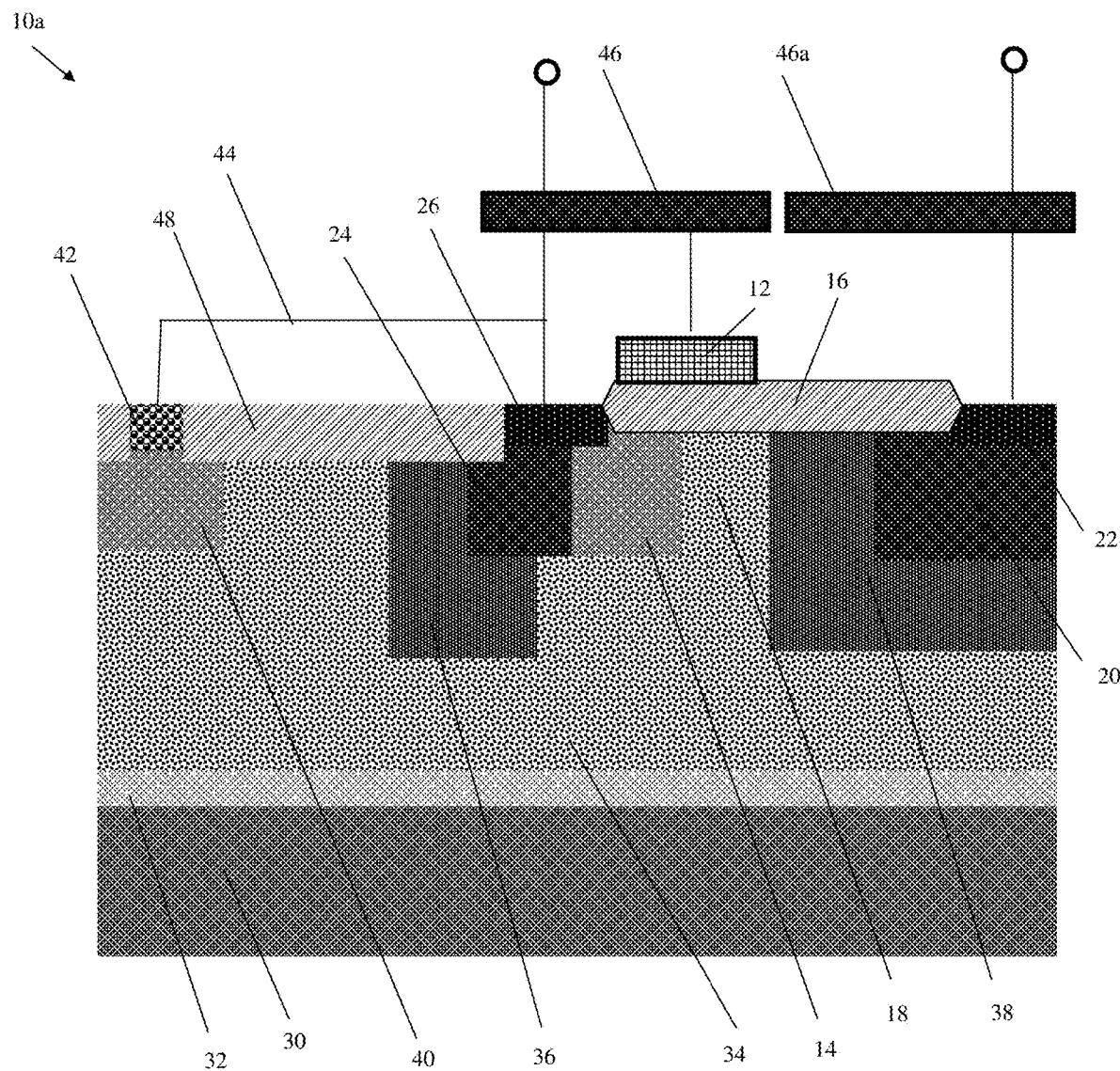
FIGS. 2-6 show alternative high-voltage electrostatic discharge devices in accordance with additional aspects of the present disclosure.

FIG. 2 shows a high-voltage electrostatic discharge device in accordance with additional aspects of the present disclosure. In the device 10a of FIG. 2, the silicide block over the thermally grown oxide 16 may be eliminated. The remaining features of the device 10b are similar in structure and function to the device 10 shown in FIG. 1.

Figure 3:
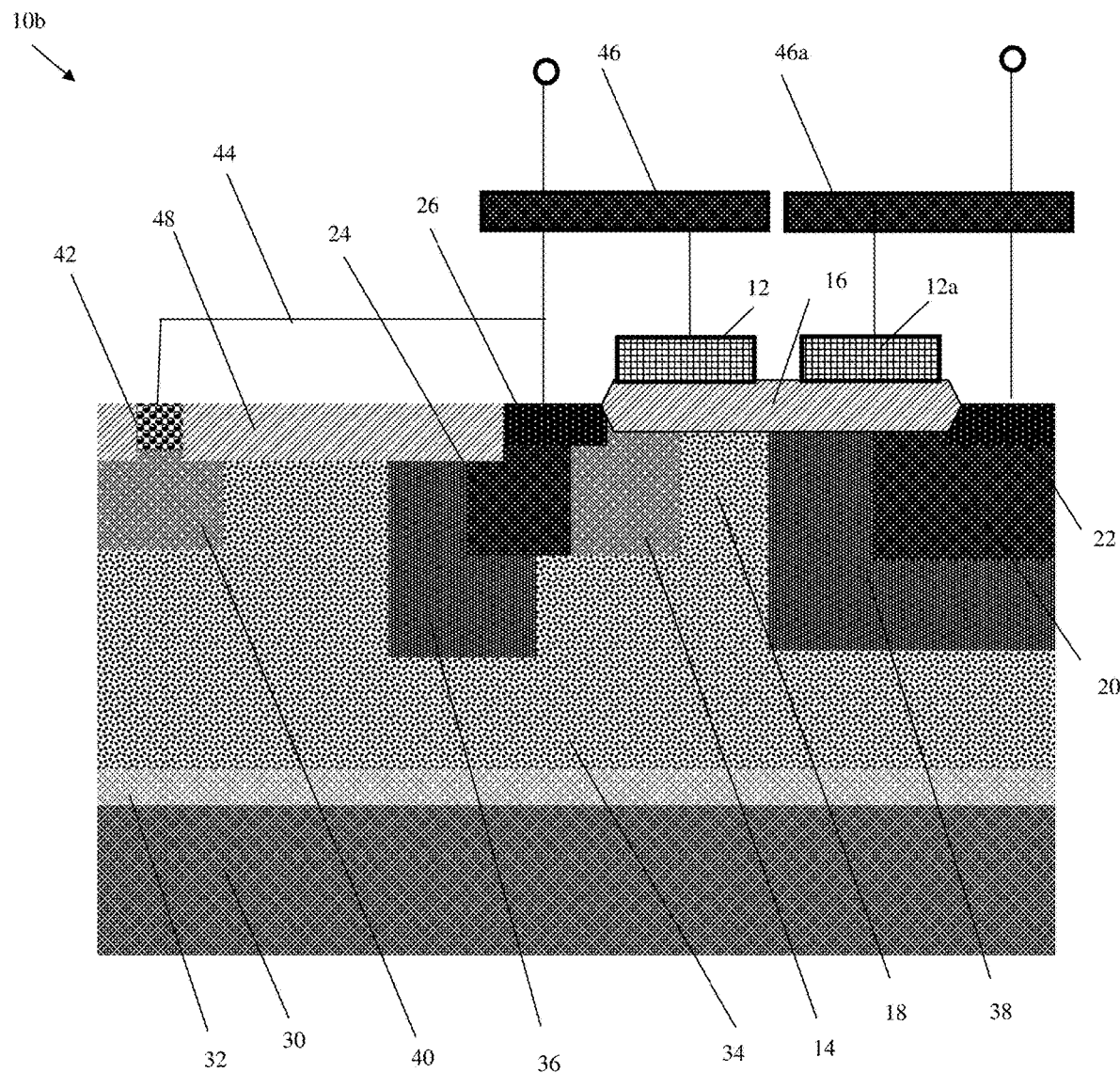

FIG. 3 shows a high-voltage electrostatic discharge device in accordance with additional aspects of the present disclosure. In the device 10b of FIG. 3, the silicide block over the thermally grown oxide 16 may be removed. In addition, the device 10 includes an additional field plate 12a formed over the thermally grown oxide 16. The additional field plate 12a may be over the collector region and, in particular, may be electrically connected to the field plate 46a connecting to the collector region, e.g., p-doped regions 20, 22, 38. The additional field plate 12a may also be polysilicon material. The remaining features of the device 10b are similar in structure and function to the device 10 shown in FIG. 1.

Figure 4:
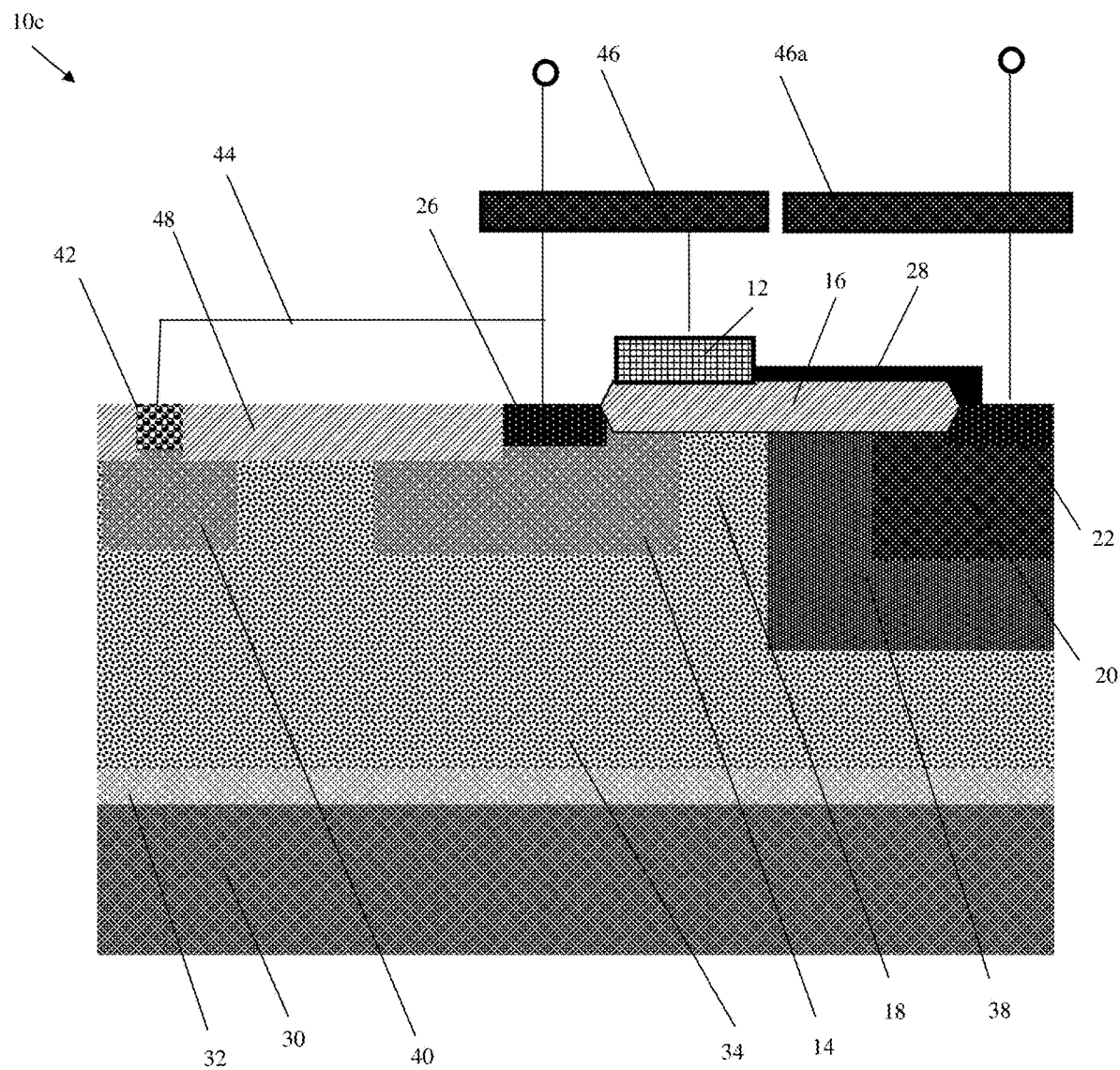

FIG. 4 shows a high-voltage electrostatic discharge device in accordance with additional aspects of the present disclosure. In the device 10c of FIG. 4, the P+ contact region 26 may be entirely within the N-doped region 14. In this embodiment, the shallow trench isolation region 48 may extend into the n-type doped regions 14, 40 and contact the doped contact regions 26, 42. Also, in this embodiments, the doped regions 24, 36 of the device 10 of FIG. 1 may be removed, with the contact region 26 being representative of the emitter region. The remaining features of the device 10c are similar in structure and function to the device 10 shown in FIG. 1.

Figure 5:
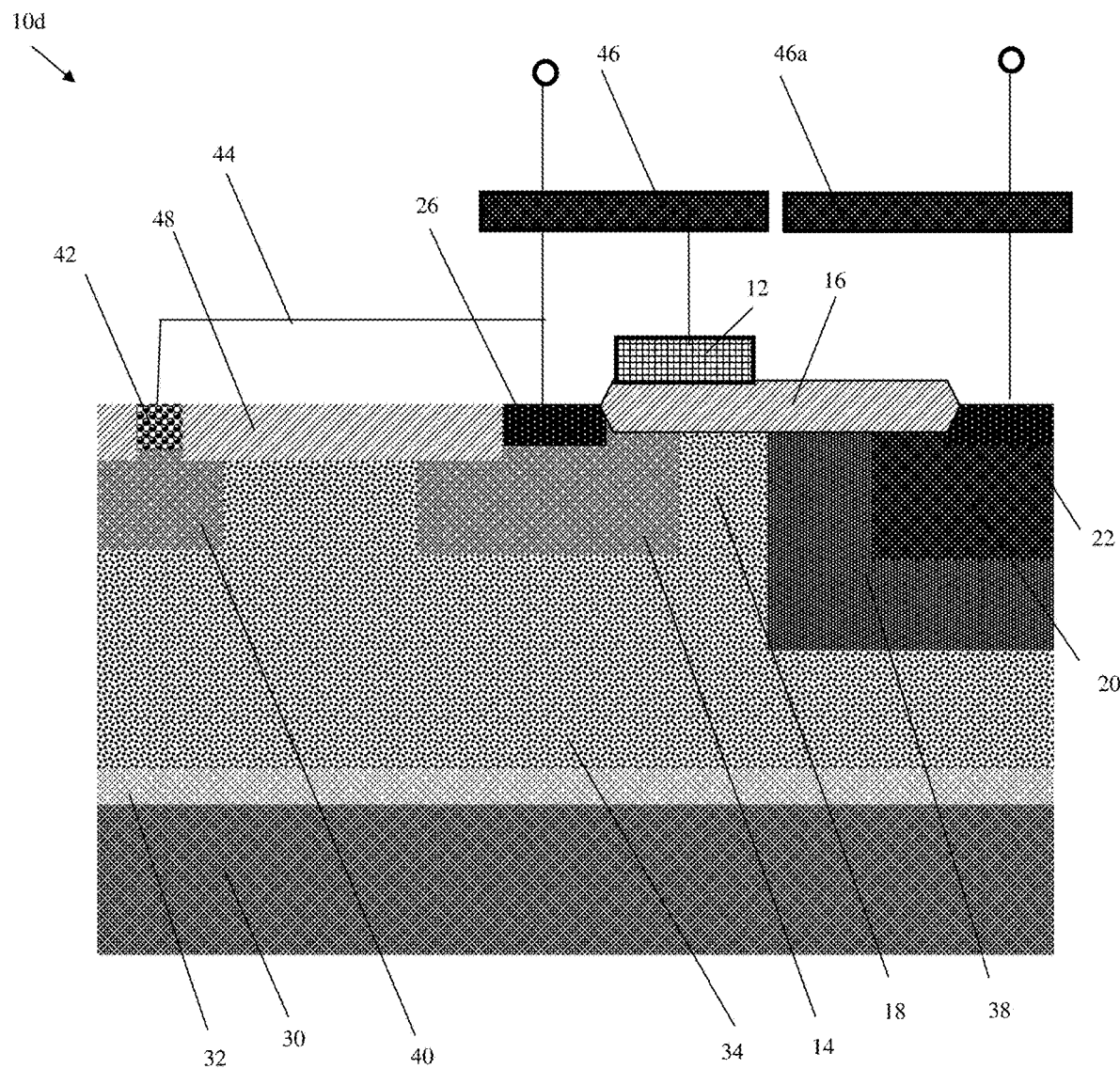

FIG. 5 shows a high-voltage electrostatic discharge device in accordance with additional aspects of the present disclosure. The device 10d of FIG. 5 is similar to the device 10c of FIG. 4, except the silicide block of FIG. 4 is removed in the device 10d. More specifically, in the device 10d of FIG. 5, the P+ contact region 26 may be entirely within the N-doped region 14. In this embodiment, the shallow trench isolation region 48 may extend into the n-type doped regions 14, 40 and contact the doped regions 26, 42. Also, in this embodiments, the doped regions 24, 36 and the silicide block 28 of the device 10 of FIG. 1 may be removed. The remaining features of the device 10d are similar in structure and function to the device 10 shown in FIG. 1 or device 10c of FIG. 4.

Figure 6:
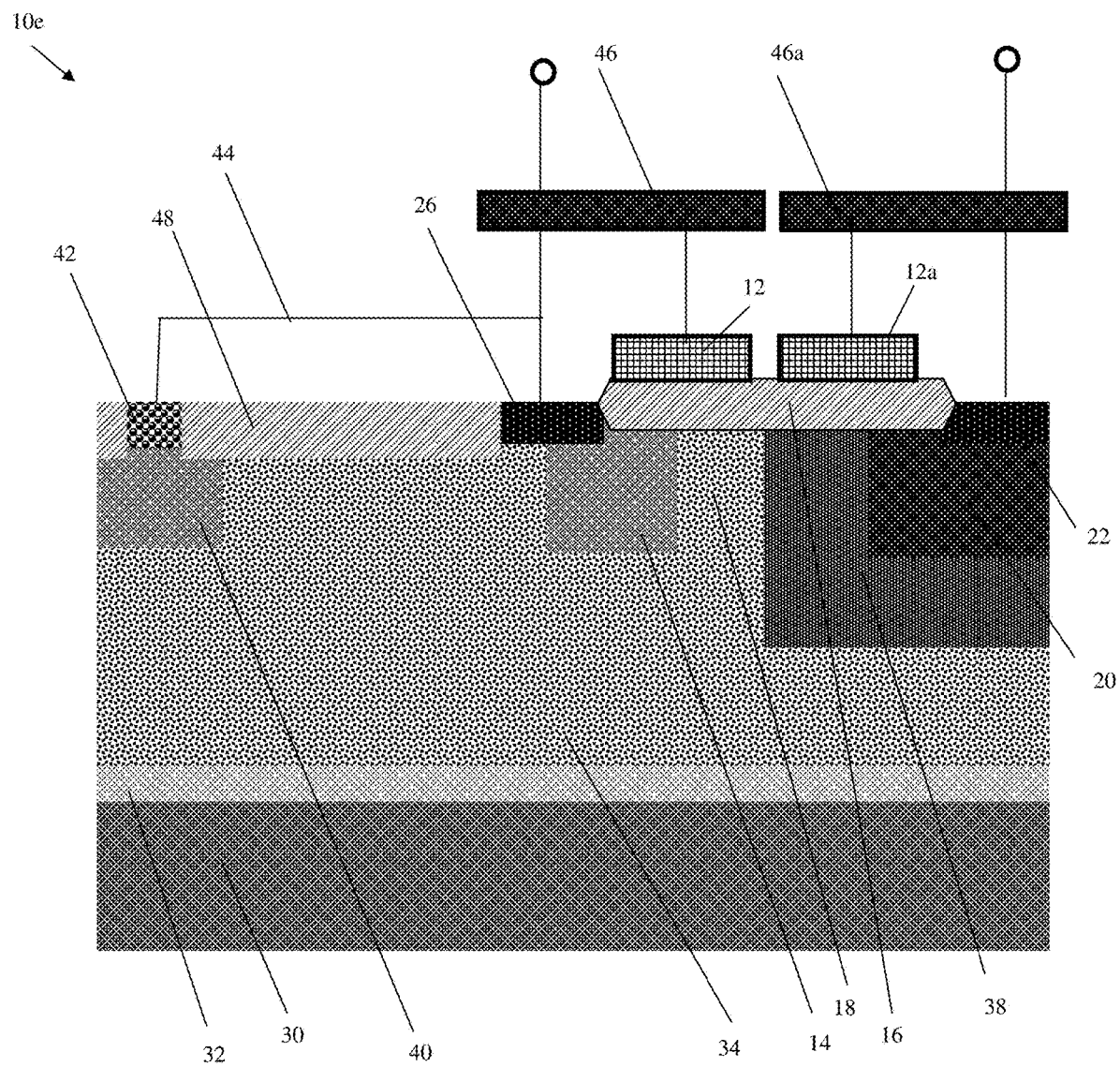

FIG. 6 shows a high-voltage electrostatic discharge device in accordance with additional aspects of the present disclosure. The device 10e of FIG. 6 is similar to the device 10d of FIG. 5, with the addition of an additional field plate 12a on the thermally grown oxide 16. More specifically, in the device 10e of FIG. 6, the P+ contact region 26 may be partially within the N-doped region 14 and the N-semiconductor material 34. In this embodiment, the shallow trench isolation region 48 may extend into the n-type doped region 40 and contacting the doped regions 26, 42. Also, in this embodiments, the doped regions 24, 36 and the silicide block 28 of the device 10 of FIG. 1 may be removed. Also, the additional field plate 12a may be over the collector region and, in particular, may be electrically connected to the field plate 46a which electrically connects to the collector region, e.g., p-doped regions 20, 22, 38. The additional field plate 12a may also be polysilicon material. The remaining features of the device 10e are similar in structure and function to the device 10 shown in FIG. 1.

The structures can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor material comprising an emitter region, a base region adjacent to the emitter region, and a collector region;
a thermally grown insulator region on the semiconductor material extending from the base region to the collector region; and
a field plate on the thermally grown insulator region, partially overlapping with the base region, laterally remote from a side edge of the collector region and closer to the emitter region than the collector region,
wherein the emitter region comprises a stepped junction, the stepped junction comprises p-typed doped regions at different depths of the semiconductor material in which a first region of the p-typed doped regions laterally abuts the base region and a second region of the p-typed doped regions is deeper than the first region and is remotely positioned away from the base region.

2. The structure of claim 1, wherein the field plate is polysilicon material.

3. The structure of claim 1, wherein the field plate extends over a drift region comprising the semiconductor material that separates the collector region and the base region.

4. The structure of claim 1, further comprising a silicide block material on the thermally grown insulator region, adjacent to the field plate and extending to over the collector region.

5. The structure of claim 1,
wherein the thermally grown insulator region comprises a local oxidation of the semiconductor material which extends above a top surface of the semiconductor material, and further comprising:
a doped region in the semiconductor material, the doped region being separated from the emitter region by a shallow trench isolation region, the doped region being electrically connected to the base region and the field plate by a first metal field plate extending over the emitter region and the field plate.

6. The structure of claim 1, wherein the emitter region comprises a first dopant type partially extending within the base region comprising a second dopant type.

7. The structure of claim 6, further comprising a second field plate on the thermally grown insulator region and electrically connected to the collector region.

8. A structure comprising:
a semiconductor material comprising an emitter region, a base region adjacent to the emitter region, and a collector region;
a thermally grown insulator region on the semiconductor material extending from the base region to the collector region;
a field plate on the thermally grown insulator region, partially overlapping with the base region, laterally remote from a side edge of the collector region and closer to the emitter region than the collector region; and
a first metal field plate that extends over the emitter region and the field plate and electrically connects to the emitter region, the base region and the field plate, and a second metal field plate electrically connected to the collector region.

9. The structure of claim 8, further comprising a second field plate on the thermally grown insulator region which electrically connects to the collector region.

10. A structure comprising:
a semiconductor material comprising an emitter region of a first dopant type, a base region of a second dopant type, and a collector region of the first dopant type;
a thermal oxide region in the semiconductor material extending from the base region to the collector region;
a field plate on the thermal oxide region and partially overlapping with the base region; and
a wiring structure electrically coupling the field plate to the base region and the emitter region, wherein the wiring structure comprises a first metal field plate that extends over the emitter region and the field plate and electrically connects to the emitter region, the base region and the field plate, and a second metal field plate electrically connected to the collector region.

11. The structure of claim 10, further comprising a silicide block material on the thermal oxide region adjacent to the field plate.

12. The structure of claim 10, wherein the thermal oxide region extends within and above a surface of the semiconductor material, and thermal oxide region spans over a portion of the semiconductor material that separates the collector region from the base region.

13. The structure of claim 10, further comprising a second field plate on the thermal oxide region, the second field plate being electrically coupled to the collector region.

14. The structure of claim 10, wherein the emitter region comprises a stepped junction with the first dopant type at different concentrations.

15. The structure of claim 10, wherein the emitter region of the first dopant type is partially within the base region of the second dopant type, and the field plate on the thermal oxide is laterally remote from a side edge of the collector region and closer to the emitter region than the collector region.

16. The structure of claim 10, wherein the emitter region of the first dopant type is fully within the base region of the second dopant type.

* * * * *